(12) United States Patent
Takamiya et al.

(10) Patent No.: US 8,202,445 B2
(45) Date of Patent: Jun. 19, 2012

(54) METAL POLISHING COMPOSITION AND CHEMICAL MECHANICAL POLISHING METHOD

(75) Inventors: Sumi Takamiya, Shizuoka-ken (JP);
Tadashi Inaba, Shizouka-ken (JP);
Atsushi Mizutani, Shizuoka-ken (JP);
Tomoo Kato, Shizuoka-ken (JP);
Toshiyuki Saie, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 460 days.

(21) Appl. No.: 12/404,353

(22) Filed: Mar. 16, 2009

(65) Prior Publication Data

US 2009/0246956 A1    Oct. 1, 2009

(30) Foreign Application Priority Data

Mar. 25, 2008  (JP) ................ 2008-079072
Dec. 2, 2008   (JP) ................ 2008-307211

(51) Int. Cl.
*C09K 13/06* (2006.01)

(52) U.S. Cl. ....... 252/79.4; 252/79.2; 438/692; 216/108

(58) Field of Classification Search ............... 252/79.1, 252/79.2, 79.3, 79.4; 438/691, 692, 693; 216/108, 88
See application file for complete search history.

(56) References Cited

U.S. PATENT DOCUMENTS

| | | | |
|---|---|---|---|
| 4,944,836 A | | 7/1990 | Beyer et al. |
| 5,756,256 A | * | 5/1998 | Nakato et al. ............... 430/272.1 |
| 2003/0228763 A1 | * | 12/2003 | Schroeder et al. ........... 438/691 |
| 2004/0115944 A1 | * | 6/2004 | Matsui ........................ 438/692 |
| 2005/0136805 A1 | * | 6/2005 | Suzuki et al. ................ 451/41 |
| 2009/0064597 A1 | * | 3/2009 | Etoh et al. .................... 51/298 |
| 2009/0302266 A1 | * | 12/2009 | Takemura et al. ........... 252/79.1 |

FOREIGN PATENT DOCUMENTS

| | | |
|---|---|---|
| JP | 49-122432 | 11/1974 |
| JP | 2-278822 | 11/1990 |
| JP | 2005-116987 | 4/2005 |

OTHER PUBLICATIONS

Journal of Electrochemical Society, 1991, vol. 138 (11), pp. 3460 to 3464.
Journal of Electrochemical Society, 2000, vol. 147 (10), pp. 3907 to 3913.

* cited by examiner

*Primary Examiner* — Lan Vinh
(74) *Attorney, Agent, or Firm* — SOLARIS Intellectual Property Group, PLLC

(57) ABSTRACT

The invention provides a metal polishing composition that is used in chemical mechanical polishing in production of a semiconductor device, and includes an oxidizing agent, an abrasive grain, and at least one compound selected from compounds represented by the following formula (I) and the following formula (II). The invention also provides a chemical mechanical polishing method that uses the metal polishing composition. In formula (I), $R^1$ represents a hydrogen atom or an alkyl group, and Ph represents a phenyl ring. In formula (II), $R^2$ represents a hydrogen atom or an alkyl group, and Ph represents a phenyl ring.

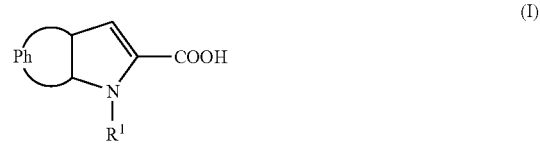

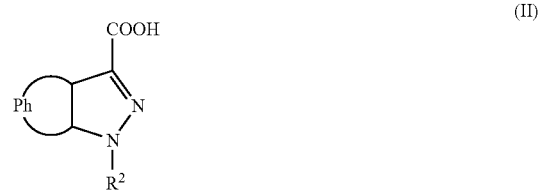

7 Claims, No Drawings

METAL POLISHING COMPOSITION AND CHEMICAL MECHANICAL POLISHING METHOD

CROSS-REFERENCE TO RELATED APPLICATION

This application claims priority under 35 USC 119 from Japanese Patent Application Nos. 2008-079072 and 2008-307211, the disclosures of which are incorporated by reference herein.

BACKGROUND OF THE INVENTION

1. Field of the Invention

The present invention relates to a metal polishing composition that is used to perform chemical mechanical planarization in a process of producing a semiconductor device and a polishing method therewith.

2. Description of the Related Art

In the development of semiconductor devices typified in large-scale integrated circuit s (hereinafter, referred to as "LSI" in some cases), a method of miniaturization and integration of wirings has been studied to achieve higher integration and higher speed of a semiconductor device. As a technology for realizing this, various technologies such as chemical mechanical polishing (hereinafter, referred to as "CMP" in some cases) have been adopted. The CMP is used to polish a metal thin film used as an interlayer insulating film ($SiO_2$) or a wiring to planarize a substrate or to remove a superfluous metal thin film at the time of forming the wiring (see, for instance, U.S. Pat. No. 4,944,836).

A general method of the CMP is as follows.

A polishing pad is bonded onto a circular polishing platen and a surface of the polishing pad is wetted with a polishing liquid. A surface of a substrate (wafer) is pressed against the polishing pad and predetermined pressure (polishing pressure) is applied from a back surface thereof. In this state, both of the polishing platen and the substrate are rotated. In the CMP, mechanical friction generated by the above operation is used to planarize a surface of the substrate.

As an interconnecting metal, tungsten and aluminum have been generally used in interconnection structures. However, LSIs that use copper lower in wiring resistance than these metals have been developed to achieve higher performance. As a method of interconnecting the copper, a damascene method is known (see, for instance, Japanese Patent Application Laid-Open (JP-A) No. 2-278822). Furthermore, a dual damascene method where a contact hole and an interconnecting groove are simultaneously formed in an interlayer insulating film and a metal is buried in both has come to be widely used. As a target material for copper wiring, high purity copper targets of five nines or more are being shipped.

However, recently, with a demand for higher densification of LSIs, improvement in the electroconductivity and electronic characteristics of copper wirings is demanded to realize miniaturization of wirings. In this regard, use of a copper alloy obtained by adding a third component to high purity copper has begun to be studied.

Furthermore, a high-speed metal polishing method capable of improving the productivity of a high precision and high purity material without causing contamination is in demand. In particular, since copper is a soft metal, when copper or a copper alloy is polished, a phenomenon where only a center portion is polished deeper to form a dish-like dent (dishing), a phenomenon where a plurality of interconnecting metal surfaces forms a dish-like concave portion (erosion) or a polishing scratch is likely to occur; accordingly, a higher precision polishing technology is increasingly in demand.

In recent years, a wafer size has been enlarged to improve the productivity. At present, wafers having a diameter of 200 mm or more are in general use, and wafers having a diameter of 300 mm or more have begun to be produced. With the increase in the size of wafers, the polishing speed difference between a wafer center portion and a wafer peripheral portion tends to be larger. Accordingly, the capability to uniform carry out polishing within the plane of a wafer has begun to be strongly demanded.

On the other hand, a chemical polishing method that depends only on dissolution and does not apply the mechanical polishing method is disclosed for copper and copper alloys (see, for instance, JP-A No. 49-122432). However, since the chemical polishing method polishes depending only on chemical dissolution, a problem of over-polishing a concave portion, that is, dishing, tends to occur in comparison with the CMP which selectively chemically and mechanically polishes a metal film of a convex portion, and accordingly, the flatness is problematic.

In order to overcome the problems in the CMP which uses solid abrasive grains, a metal surface polishing method that uses a combination of a polishing liquid that does not contain abrasive grains and dry etching is disclosed (see, for instance, Journal of Electrochemical Society, 2000, Vol. 147 (10), pp. 3907 to 3913).

When copper wirings are used in the LSI production, a diffusion blocking layer called a barrier layer is generally disposed between a wiring portion and an insulating layer to inhibit copper ions from diffusing to an insulating material. The barrier layer is formed of a barrier material such as TaN, TaSiN, Ta, TiN, Ti, Nb, W, WN, Co, Zr, ZrN, Ru, CuTa alloy, $MnSi_xO_y$, or $MnO_x$, and at least one layer thereof is disposed. The barrier materials themselves have electroconductivity, and accordingly, the barrier material on the insulating layer has to be completely removed to avoid errors such as a leakage current from occurring. In the removing process, a method similar to the polishing of a bulk of a metal wiring material may be applied. This is so-called barrier CMP.

In the bulk polishing of copper, dishing tends to occur in a wide metal wiring portion in particular. Accordingly, it is desirable to be able to control a polishing and removing amount between a wiring portion and a barrier portion so that planarization is ultimately achieved. For this reason, a polishing liquid for polishing the barrier is desired to have appropriate polishing selectivity of copper/barrier metal. Furthermore, since wiring pitch and wiring density are different between wiring layers of the respective levels, it is more desirable to be able to appropriately control the polishing selectivity.

A metal polishing composition that is used in the CMP generally contains solid abrasive grains (such as alumina or silica) and an oxidizing agent (such as hydrogen peroxide or peroxodisulfate). A fundamental mechanism of the CMP that uses such a metal polishing composition is considered to be that the polishing is performed by oxidizing a metal surface with an oxidizing agent and, thereafter, the oxide film is removed with abrasive grains (see, for instance, Journal of Electrochemical Society, 1991, Vol. 138 (11), pp. 3460 to 3464).

A metal polishing composition containing peroxodisulfate is characterized in being capable of obtaining a high polishing speed. However, there is a problem in that dishing and erosion are likely to proceed. As one measure to overcome the dishing, benzotriazoles are added to a metal polishing composition as an anti-corrosion agent that inhibits a metal film from being polished (see, for instance, JP-A No. 2005-116987). According to the method, a protective film is formed on a metal film of a semiconductor base material, and accordingly, while convex portions are removed by abrasive grains, the metal film is left in concave portions, whereby a desired conductor pattern is obtained. The protective film in the concave portions inhibits the dishing from occurring, and accordingly, high flatness is obtained. However, in the CMP, the erosion caused by eroding of the barrier film is not inhibited from occurring even when a metal polishing composition that uses an anti-corrosion agent that can obtain high flatness is used. That is, there is the demand for the flatness necessary for producing devices to be further improved.

SUMMARY OF THE INVENTION

The present invention has been achieved based on the background that a metal polishing composition (CMP slurry) capable of realizing higher speed polishing of wirings made of, for instance, copper metal and copper alloys is demanded for improving the productivity of semiconductor devices typified by LSIs.

A first aspect of the invention is to provide a metal polishing composition that is used in chemical mechanical polishing in production of a semiconductor device. The metal polishing composition contains at least the following respective components (1) to (3)
(1) an oxidizing agent,
(2) an abrasive grain, and
(3) at least one compound selected from a compound represented by the following formula (I) and a compound represented by the following formula (II):

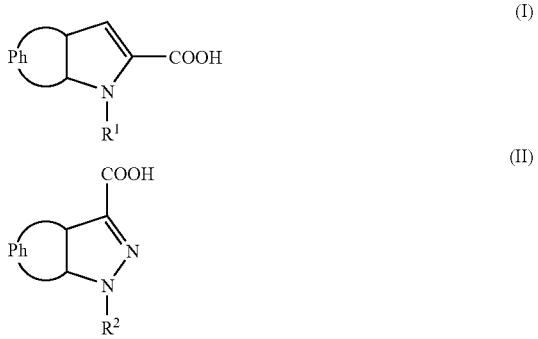

In formula (I), $R^1$ represents a hydrogen atom or an alkyl group, and Ph represents a phenyl ring. In formula (II), $R^2$ represents a hydrogen atom or an alkyl group, and Ph represents a phenyl ring.

A second aspect of the invention is to provide a chemical mechanical polishing method that includes a process of feeding a metal polishing composition of the invention onto a polishing pad on a polishing platen, and a process of rotating the polishing platen and thereby relatively moving the polishing pad with respect to a polishing surface of an object to be polished, while contacting the polishing pad with the polishing surface, in order to polish the polishing surface

DETAILED DESCRIPTION OF THE INVENTION

Hereinbelow, specific exemplary embodiments of the invention will be described. In the specification, "to" shows a range containing numerical values described before and after the "to" as the minimum value and the maximum value, respectively.

1. Metal Polishing Composition

A metal polishing composition of the invention includes at least the following components (1) to (3):
(1) an oxidizing agent
(2) an Abrasive grains
(3) at least one compound selected from a compound represented by the following formula (I) and a compound represented by the following formula (II).

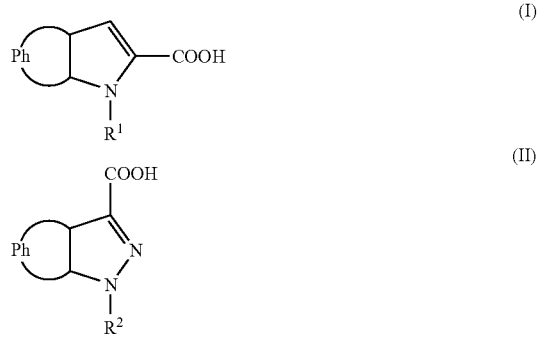

In formula (I), $R^1$ represents a hydrogen atom or an alkyl group, and Ph represents a phenyl ring. In formula (II), $R^2$ represents a hydrogen atom or an alkyl group, and Ph represents a phenyl ring.

The metal polishing composition of the invention may contain, in addition to the respective components from the (1) to (3), an organic acid, a surfactant and other components, as required.

The metal polishing composition of the invention usually takes a form of slurry obtained by dispersing abrasive grains in an aqueous solution in which the respective components are dissolved.

The respective components contained in the metal polishing composition of the invention will be detailed below. The respective components may be used singularly or in a combination of at least two kinds thereof.

The metal polishing composition of the invention is useful, in production of semiconductor devices, as a polishing composition that is used in the chemical mechanical polishing of an object to be polished. In the invention, a "metal polishing composition" (hereinafter, referred to as "polishing composition" as well) includes not only a metal polishing composition having a composition (concentration) that is used in the polishing but also a condensed polishing liquid that is used by diluting at the time of use, unless stated clearly. The condensed liquid is diluted with water or an aqueous solution when it is used to polish and a dilution factor is generally 1 to 20 times by volume.

1-2. Compounds Represented by Formula (I) and Compounds Represented by Formula (II)

The metal polishing composition of the invention contains at least one compound selected from a compound represented by the following formula (I) and a compound represented by the following formula (II), and the compound may function as a passivation film forming agent in the metal polishing composition of the invention. Hereinbelow, the compound represented by formula (I) and the compound represented by formula (II) are described by appropriately generically calling as "specific passivation film forming agent".

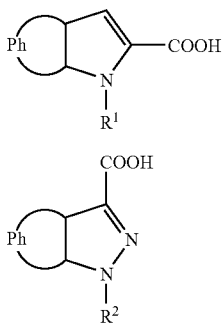

In formula (I), $R^1$ represents a hydrogen atom or an alkyl group, and Ph represents a phenyl ring. In formula (II), $R^2$ represents a hydrogen atom or an alkyl group, and Ph represents a phenyl ring.

In formula (I), as the alkyl group represented by $R^1$, an alkyl group having 1 to 3 carbon atoms is preferred, and an alkyl group having 1 to 2 carbon atoms is more preferred. Specific examples of the alkyl group include a methyl group, an ethyl group and a propyl group, a methyl group and an ethyl group being more preferred. Furthermore, $R^1$ is more preferably a hydrogen atom or a methyl group.

In formula (II), as the alkyl group represented by $R^2$, an alkyl group having 1 to 3 carbon atoms is preferred, and an alkyl group having 1 to 2 carbon atoms is more preferred. Specific examples of the alkyl group include a methyl group, an ethyl group and a propyl group, a methyl group and an ethyl group being more preferred. Furthermore, $R^2$ is more preferably a hydrogen atom or a methyl group.

In the compound represented by formula (I), a substituent group other than $R^1$ and a carboxyl group at 2-position may be further introduced in a indole skeleton. Furthermore, in the compound represented by formula (II), a substituent group other than $R^2$ and a carboxyl group at 3-position may be further introduced in an indazole skeleton.

Examples of substituent groups that are introduced in the indole skeleton in formula (I) or the indazole skeleton in formula (II) include preferably an alkyl group, an alkoxy group, a carboxyl group, a hydroxyl group, a sulfo group and an amino group, more preferably an alkyl group, a carboxyl group and a hydroxyl group and still more preferably an alkyl group.

In the case where a substituent group is further introduced in the indole skeleton in formula (I), a substitution position of the substituent group is preferably a 3-position, 5-position or 6-position. In the case where a substituent group is further introduced in the indazole skeleton in formula (II), a substitution position of the substituent group is preferably a 5-position or 6-position.

In the case where Ph (phenyl ring) in the indole skeleton in formula (I) or Ph (phenyl ring) in the indazole skeleton in formula (II) has at least two substituent groups, the substituent groups may bond with each other to form a ring structure.

The compounds represented by formula (I) and the compounds represented by formula (II) are preferred not to have a substituent group other than a carboxyl group in a molecular structure thereof.

Among the compounds represented by formula (I) and compounds represented by formula (II), the compounds represented by formula (I) are preferred from the viewpoint of maintaining high polishing speed.

In what follows, specific examples of the compounds represented by formula (I) and the compounds represented by formula (II) (specific passivation film forming agents) will be exemplified without restricting the invention thereto.

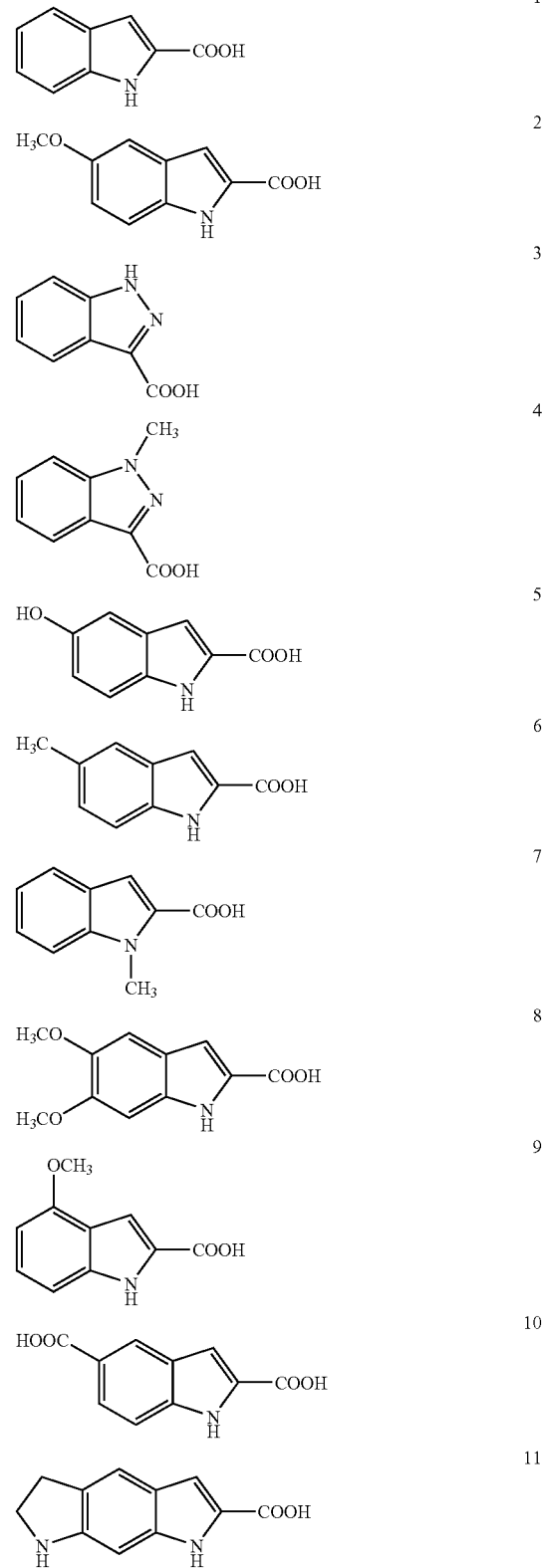

12

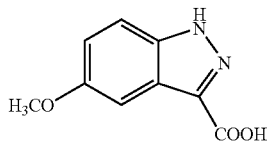

A content of the specific passivation film forming agent in the polishing composition of the invention is, by total amount, preferably in a range of $1\times10^{-8}$ mol to $1\times10^{-1}$ mol, more preferably in a range of $1\times10^{-7}$ mol to $1\times10^{-1}$ mol, and still more preferably in a range of $1\times10^{-6}$ mol to $1\times10^{-1}$ mol in 1 L of the metal polishing composition that is used at polishing.

1-3. Oxidizing Agent

The polishing composition of the invention includes a compound (an oxidizing agent) that may oxidize a metal that is an object to be polished.

Examples of the oxidizing agent include, for example, hydrogen peroxide, peroxide, nitrate, iodate, periodate, hypochlorite, chlorite, chlorate, perchlorate, peroxodisulfate, silver (II) salt and iron (III) salt.

Among the oxidizing agents, hydrogen peroxide, a peroxodisulfate, ethylenediamine-N,N,N',N'-tetraacetate of iron (III), a complex of 1,3-diaminopropane-N, N,N',N'-tetraacetate and ethylenediamine disuccinate (SS body) are preferred, and a peroxodisulfate is most preferred.

Among the peroxodisulfate, potassium peroxodisulfate and ammonium peroxodisulfate are preferred, and ammonium peroxodisulfate is most preferred.

A content of the oxidizing agent is preferably 0.003 mol to 8 mol, more preferably 0.03 mol to 6 mol and still more preferably 0.05 mol to 2 mol, based on 1 L of the polishing composition used at polishing. That is, the content of the oxidizing agent in the polishing composition is preferably 0.003 mol or more from the viewpoint of being sufficient in oxidation of the metal and securing high CMP speed, and preferably 8 mol or less from the viewpoint of suppressing a polishing surface from roughening.

1-4. Abrasive Grains

The polishing composition of the invention contains abrasive grains. Examples of preferable abrasive grains include, for example, silicon oxide particles (silica: precipitated silica, fumed silica, colloidal silica, synthetic silica), ceria, alumina, titania, zirconia, germania, and manganese oxide. Among these, silicon oxide particles are preferred and colloidal silica (in particular, colloidal silica of 20 nm to 50 nm) is particularly preferred. The colloidal silica is preferably 2 or less in the degree of association. Herein, the degree of association is a value obtained by dividing a diameter of a secondary particle formed by flocculating primary particles by a diameter of a primary particle (diameter of secondary particle/diameter of primary particle). The degree of association of 1 means that only monodispersed primary particles are present. A diameter of the secondary particles may be measured with an electron microscope.

As a preparation method of colloidal silica that is preferably used as the abrasive grains, a preparation method where a silicon alkoxide compound such as $Si(OC_2H_5)_4$, $Si(sec-OC_4H_9)_4$, $Si(OCH_3)_4$ or $Si(OC_4H_9)_4$ is hydrolyzed by use of a sol-gel method may be used. Thus-obtained colloidal silica has a very sharp particle size distribution.

Herein, the primary particle diameter of the abrasive grains means, when a particle size cumulative curve that shows the relationship between particle diameters of the abrasive grains and the cumulative frequencies obtained by integrating the number of particles having the particle diameters is obtained, a particle diameter at a point where the cumulative frequency of the curve is 50%. For instance, as a measurement unit for obtaining a particle size distribution curve, LB-500 (trade name, manufactured by Horiba Ltd.) may be used.

The value as measured may be adopted when particles of abrasive grains are spherically shaped. However, a size of a particle having an amorphous shape shows a diameter of a sphere having the same volume as the particle. The particle size may be measured by various known methods such as a photon interaction method, a laser diffraction method or a coulter counter method. However, in the invention, a method of observing with a scanning microscope or a method of taking a photograph with a transmission electron microscope, followed by obtaining shapes and sizes of the individual particles, further followed by calculating is used.

An average particle diameter (primary particle diameter) of the abrasive grains contained in the polishing composition of the invention is preferably 20 nm to 150 nm, and more preferably 20 nm to 50 nm. The particle diameter is preferred to be 20 nm or more from the viewpoint of achieving a sufficient polishing speed. On the other hand, the particle diameter is preferred to be 50 nm or less from the viewpoint of not generating excessive friction heat during polishing.

Not only the above-described general inorganic abrasive grains but also organic polymer particles may be used together in a range that does not disturb advantages of the polishing composition of the invention. Furthermore, various surface-modified colloidal silica such as colloidal silica surface-modified with aluminate ions or borate ions, colloidal silica of which surface potential is controlled or composite abrasive grains made of a plurality of materials may be used in accordance with the purpose.

An addition amount of the abrasive grains in the polishing composition in the invention may be appropriately selected depending on the purpose and is generally in a range of 0.001 to 20% by mass relative to a total mass of the metal polishing composition. In the invention, excellent polishing characteristics may be exerted owing to addition effect of the specific passivation film forming agent and the oxidizing agent even when an addition amount of the abrasive grains is less than 1.0% by mass. Accordingly, an addition amount of the abrasive grains is preferred to be less than 1.0% by mass and more preferably in the range of 0.01 to 0.5% by mass from the viewpoint of inhibiting the abrasive grains from causing scratch.

1-5. Other Components

The polishing composition of the invention may contain, in addition to above-described components, following components, as required. In what follows, optional components applicable to the polishing composition of the invention will be described.

1-5-1. Organic Acid

The metal polishing composition according to the invention preferably further contains at least one kind of organic acid. The organic acid herein works not as an oxidizing agent of metal but as an oxidation accelerator, a pH adjusting agent or a buffering agent. Examples of the organic acid include, for example, compounds shown below.

The organic acid is preferred to be water-soluble. As such organic acids, those selected from a group shown below are more preferred. That is, formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, hydroxyethyliminodiacetic acid, iminodiacetic acid, acetamideiminodiacetic acid, nitrilotripropionic acid, nitrilotrimethyl phosphonic acid, dihydroxyethyl glycine, tricine, salts such as ammonium salts or alkali metal salts of these acids or mixtures thereof are included.

Furthermore, amino acids as well may be preferably used as organic acid in the invention. The amino acid is preferred to be water-soluble and those selected from a group shown below are more preferred. That is, glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-tyrosine, β-(3,4-dihydroxyphenyl)-L-alanine, L-thyroxine, 4-hydroxy-L-proline, L-cysteine, L-methionine, L-ethionine, L-lanthionine, L-cystathionine, L-cystine, L-cystein acid, L-aspartic acid, L-glutaric acid, S-(carboxymethyl)-L-cysteine, 4-aminobutyric acid, L-asparagine, L-glutamine, azaserine, L-arginine, L-canavanine, L-citrulline, δ-hydroxy-L-lysine, creatine, L-kynurenine, L-histidine, 1-methyl-L-histidine, 3-methyl-L-histidine, ergothioneine, L-tryptohan, actinomycin C1, apamine, angiotensin I, angiotensin II and antipine are included.

In the invention, among the organic acids, aminocarboxylic acids shown below are particularly preferably used. That is, glycine, iminodiacetic acid, methyliminodiacetic acid, N-methylglycine, nitrilotripropanoic acid, hydroxyethyliminodiacetic acid, β-alanine, glycylglycine, dihydroxyethylglycine, acetamideiminodiacetic acid and tricine are included.

An addition amount of the organic acid is preferably in a range of 0.005 mol to 0.5 mol, more preferably in the range of 0.01 mol to 0.3 mol and particularly preferably in the range of 0.05 mol to 0.3 mol in 1 L of the metal polishing composition that is used at polishing. That is, the organic acid is preferably added 0.01 mol or more from the viewpoint of improving the polishing speed, and preferably 0.3 mol or less from the viewpoint of inhibiting deterioration of dishing.

In the metal polishing composition of the invention, the organic acids may be used singularly or in a combination of at least two kinds thereof.

Furthermore, the organic acids may be synthesized according to a standard method or commercially available products may be used.

1-5-2. Surfactant

The metal polishing composition of the invention preferably contains a surfactant. As the surfactant, an acid type is desirable. When the surfactant takes a salt structure, the salt structure includes ammonium salt structure, potassium salt structure, and sodium salt structure, and ammonium salt structure and potassium salt structure are particularly preferred.

The surfactants all work so as to lower a contact angle to a surface to be polished and thereby promote uniform polishing. Surfactants used in the metal polishing composition of the invention preferably include surfactants detailed below.

Examples of anionic surfactants include carboxylate, sulfonate, ester sulfate, and ester phosphate. Examples of carboxylate include soap, N-acylamino acid salt, polyoxyethylene or polyoxypropylene alkyl ether carboxylate and acylated peptide. Examples of the sulfonate include alkyl sulfonate, alkylbenzene and alkylnaphthalene sulfonate, naphthalene sulfonate, (alkyl)naphthalene sulfonate formalin condensate, sulfosuccinate, α-olefin sulfonate, N-acyl sulfonate, alkyl diphenyl ether monosulfonate and alkyl diphenyl ether disulfonate. Examples of ester sulfate include sulfated oil, alkyl sulfate, alkyl ether sulfate, polyoxyethylene or polyoxypropylene alkyl allyl ether sulfate and alkyl amide sulfate. Examples of ester phosphate include alkyl phosphate and polyoxyethylene or polyoxypropylene alkyl allyl ether phosphate.

Examples of cationic surfactant include fatty acid amine salt, aliphatic quaternary ammonium salt, benzalconium chloride, benzethonium chloride, pyridinium salt and imidazolium salt. Examples of amphoteric surfactants include carboxy betaine, sulfobetaine, aminocarboxylate, imidazolinium betaine, lecithin and alkylamine oxide.

Examples of nonionic surfactants include ether type, ether ester type, ester type and nitrogen-containing type. Examples of ether type include polyoxyethylene alkyl and alkylphenyl ether, alkyl allyl formaldehyde condensation polyoxyethylene ether, polyoxyethylene-polyoxypropylene block polymer and polyoxyethylene-polyoxypropylene alkyl ether. Examples of ether-ester type include polyoxyethylene ether of glycerin ester, polyoxyethylene ether of sorbitan ester and polyoxyethylene ether of sorbitol ester. Examples of ester type include polyoxyethylene glycol fatty acid ester, glycerin ester, polyglycerin ester, sorbitan ester, propylene glycol ester and sugar ester. Examples of nitrogen-containing type include fatty acid alkanolamide, polyoxyethylene fatty acid amide and polyoxyethylene alkylamide.

The surfactant is preferably an anionic surfactant. A surfactant that may be contained in the polishing composition of the invention is most preferred to be at least one surfactant selected from surfactants represented by formulae (III) through (V).

(Surfactant Represented by Formula (III))

$$R^3—Ar^1—O—Ar^2—SO_3^-M_1^+ \qquad \text{Formula (III)}$$

In formula (III), $R^3$ represents a straight or branched alkyl group having 8 to 20 carbon atoms, $Ar^1$ and $Ar^2$ each independently represent an arylene group, and $M_1^+$ represents a hydrogen ion, an alkali metal ion or ammonium.

An alkyl group represented by $R^3$ has preferably 10 to 20 carbon atoms and more preferably 12 to 20 carbon atoms. The alkyl group represented by $R^3$ may be either a straight chain or a branched chain, the straight chain being preferred. Specific examples of alkyl group represented by $R^3$ include a decyl group, an undecyl group, a dodecyl group, a tridecyl group, a tetradecyl group, a pentadecyl group, a hexadecyl group, a heptadecyl group, an octadecyl group, a nonadecyl group and an eicodecyl group. Among these, a dodecyl group, a tridecyl group, a tetradecyl group, a pentadecyl group, an octadecyl group, a nonadecyl group or an eicodecyl group is preferred.

In formula (III), $Ar^1$ and $Ar^2$ each independently represent an arylene group. Examples of the arylene group represented by $Ar^1$ or $Ar^2$ include a phenylene group, a naphthylene group, an anthrylene group and a phenanthrylene group. Among these, a phenylene group is preferred.

In formula (III), $Ar^1$ and $Ar^2$ may be same or different from each other. However, it is preferred to be same.

An alkyl group represented by $R^3$ and arylene groups represented by $Ar^1$ and $Ar^2$ may further have a substituent group. Examples of introducible groups include a halogen atom (fluorine atom, chlorine atom, bromine atom or iodine atom), an alkyl group (straight, branched or cyclic alkyl group, or polycyclic alkyl group such as a bicycloalkyl group, or may contain active methine group), an alkenyl group, an alkynyl group, an aryl group, a heterocyclic group (substitution position is not questioned), an acyl group, an alkoxycarbonyl group, an aryloxycarbonyl group, a heterocyclic oxycarbonyl group, a carbamoyl group (examples of carbamoyl groups having a substituent group include, for example, a N-hydroxycarbamoyl group, a N-acylcarbamoyl group, a N-sulfonylcarbamoyl group, a N-carbamoyl carbamoyl group, a thiocarbamoyl group and a N-sulfamoylcarbamoyl group), a carbazoyl group, a carboxy group or a salt thereof, an oxalyl group, an oxamoyl group, a cyano group, a carbonimidoyl group, a formyl group, a hydroxy group, an alkoxy group (including groups repeatedly including an ethyleneoxy group or propyleneoxy group unit), an aryloxy group, a heterocyclic oxy group, an acyloxy group, an (alkoxy or aryloxy)carbonyloxy group, a carbamoyloxy group, a sulfonyloxy group, an amino group, an (alkyl, aryl or heterocyclic)amino group, an acylamino group, a sulfoneamide group, an ureido group, a thioureido group, a N-hydroxyureido group, an imide group, an (alkoxy or aryloxy)carbonylamino group, a sulfamoylamino group, a semicarbazido group, a thiosemicarbazido group, a hydrazino group, an ammonio group, an oxamoylamino group, a N-(alkyl or aryl)sulfonylureido group, a N-acylureido group, a N-acylsulfamoylamino group, a hydroxyamino group, a nitro group, a heterocyclic group containing a quaternarized nitrogen atom (for example, pyridinio group, imidazolio group, quinolinio group, isoquinolinio group), an isocyano group, an imino group, a mercapto group, an (alkyl, aryl, or heterocyclic)thio group, an (alkyl, aryl, or heterocyclic)dithio group, an (alkyl or aryl)sulfonyl group, an (alkyl or aryl)sulfinyl group, a sulfo group, a sulfamoyl group (sulfamoyl groups having a substituent group include, for example, an N-acylsulfamoyl group and N-sulfonylsulfamoyl group), a phosphino group, a phosphinyl group, a phosphinyloxy group, a phosphinylamino group and a silyl group. Among these substituent groups, an alkyl group or a sulfo group is preferred.

In formula (III), an alkali metal ion represented by $M_1^+$ is preferably a sodium ion or potassium ion, and a sodium ion is more preferred. Furthermore, ammonium ($NH_4^+$) represented by $M_1^+$ includes those obtained by substituting a hydrogen atom of ammonium with an alkyl group. Examples of ammonium substituted with an alkyl group include methyl ammonium and ethyl ammonium. $M_1^+$ is preferably a hydrogen ion or ammonium, and a hydrogen ion is particularly preferred.

Examples of surfactants represented by formula (III) specifically include alkyl diphenyl ether disulfonic acids and salts thereof such as dodecyl diphenyl ether disulfonic acid, tetradecyl diphenyl ether disulfonic acid, hexadecyl diphenyl ether disulfonic acid, octadecyl diphenyl ether disulfonic acid or eicocyl diphenyl ether disulfonic acid; alkyl diphenyl ether monosulfonic acids and salts thereof such as dodecyl diphenyl ether monosulfonic acid, tetradecyl diphenyl ether monosulfonic acid, hexadecyl diphenyl ether monosulfonic acid, octadecyl monophenyl ether disulfonic acid or eicocyl monophenyl ether disulfonic acid; and dodecyl dinaphthyl ether disulfonic acid, dodecyl dianthoryl ether disulfonic acid, dodecyl dinaphthyl ether monosulfonic acid, dodecyl dianthoryl ether monosulfonic acid, and salts thereof.

As the surfactant represented formula (III), commercially available products as well may be used. Examples thereof include, for example, PELEX SS-H and PELEX SS-L (trade name, manufacture by KAO CORPORATION) and PIONIN A-43S, PIONIN A-200, PIONIN A-43-D and PIONIN A-43-N (trade name, manufactured by TAKEMOTO OIL & FAT CO., LTD.).

Among these, as the surfactant represented by formula (III), alkyl diphenyl ether disulfonic acid or a salt thereof, a mixture of alkyl diphenyl ether disulfonic acid and alkyl diphenyl ether monosulfonic acid, or a mixture of the salts thereof is preferred from the viewpoint of reducing the dishing. When the surfactant represented by formula (III) is a mixture such as mentioned above, alkyl diphenyl ether monosulfonic acid is preferably contained 10% by mol or more, more preferably 30% by mol or more, and still more preferably 50% by mol or more in the mixture.

(Surfactant Represented by Formula (IV))

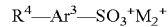 Formula (IV)

In formula (IV), $R^4$ represents a straight or branched alkyl group having 8 to 20 carbon atoms, $Ar^3$ represents an arylene group, and $M_2^+$ represents a hydrogen ion, an alkali ion or ammonium.

In formula (IV), the alkyl group represented by $R^4$ preferably has 10 to 20 carbon atoms and more preferably 12 to 20 carbon atoms. The alkyl group represented by the $R^4$ may be either a straight chain or a branched chain, a straight chin being preferred. Examples of the alkyl group represented by the $R^4$ specifically include, for example, a decyl group, a undecyl group, a dodecyl group, a tridecyl group, a tetradecyl group, a pentadecyl group, a hexadecyl group, a heptadecyl group, an octadecyl group, a nonadecyl group and an eicodecyl group, among these, a dodecyl group, a tridecyl group, a tetradecyl group, a pentadecyl group, an octadecyl group, a nonadecyl group and an eicodecyl group being preferred.

As the arylene group represented by $Ar^3$ in formula (IV), a phenylene group and a naphtylene group are included, among these a phenylene group being preferred.

An alkyl group represented by $R^4$ and an arylene group represented by $Ar^3$ in formula (IV) may further have a substituent group. Examples of introducible substituent groups include the respective substituent groups cited as substituent groups further introducible in $R^3$, $Ar^1$ and $Ar^2$ in formula (III).

An alkali metal ion represented by $M_2^+$ in formula (IV) is preferably a sodium ion or a potassium ion and a sodium ion is more preferred. Furthermore, ammonium ($NH_4^+$) represented by $M_2^+$ includes those obtained by substituting a hydrogen atom of ammonium with an alkyl group. Examples of ammonium substituted with an alkyl group include methyl ammonium and ethyl ammonium. $M_2^+$ is preferably a hydrogen ion or ammonium and a hydrogen ion is particularly preferred.

Examples of surfactants represented by formula (IV) specifically include alkylbenzene sulfonic acid or salt thereof, dodecylbenzene sulfonic acid or salt thereof, octylbenzene sulfonic acid or salt thereof, decanebenzene sulfonic acid or salt thereof, tetradecylbenzene sulfonic acid or salt thereof and hexadecylbenzene sulfonic acid or salt thereof. Among these, as the surfactant represented by formula (IV), dodecylbenzene sulfonic acid or salt thereof is preferred from the viewpoint of reducing the dishing. A straight chain dodecylbenzene sulfonic acid or salt thereof is preferred particularly from the viewpoint of easiness in biodegrading.

As the surfactant represented formula (IV), commercially available products as well may be used. Examples thereof include, for example, PIONIN A-40-S, PIONIN A-40 and PIONIN A-41-BN (trade name, manufactured by TAKEMOTO OIL & FAT CO., LTD.), SOFT OUSEN 5S, OUSEN S, NEWLEX R, NEWLEX SOFT 30-N and NEWLEXK SOFT 60-N (trade name, Nippon Oil & Fats Co., Ltd.), NEWCOLE 210m, NEWCOLE 211-MB, NEWCOLE 220L(65), NEWCOLE 263 (trade name, manufactured by Nippon Nyukazai Co., Ltd.) and NEOPELEX SS, NEOPELEX G-15, NEOPELEX G-25 and NEOPRLEX G-65 (trade name, manufacture by KAO CORPORATION).

(Surfactant Represented by Formula (V))

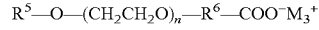 Formula (V)

In formula (V), $R^5$ represents a straight or branched alkyl group having 8 to 20 carbon atoms, n represents an integer from 1 to 20, and $R^6$ represents a straight or branched alkylene group having 1 to 5 carbon atoms. $M_3^+$ represents a hydrogen ion, an alkali ion or ammonium.

The alkyl group having 8 to 20 carbon atoms represented by $R^5$ in formula (V) preferably has 10 to 18 carbon atoms. The alkyl group represented by the $R^5$ may be either a straight chain or a branched chain, a straight chain being preferred. Examples of the alkyl group represented by the $R^5$ specifically include, for example, a decyl group, a undecyl group, a dodecyl group, a tridecyl group, a tetradecyl group, a pentadecyl group, a hexadecyl group, a heptadecyl group, an octadecyl group, a nonadecyl group and an eicodecyl group.

The alkylene group represented by $R^6$ in formula (V) preferably has 1 to 5 carbon atoms and more preferably 1 to 3 carbon atoms. The alkylene group represented by $R^6$ may be either a straight chain or a branched chain, a straight chain being more preferred.

In formula (V), an alkyl group represented by $R^5$ and an alkylene group represented by $R^6$ may further have a substituent group. Examples of introducible substituent groups include the respective substituent groups cited as substituent groups further introducible in $R^3$, Ar1 and $Ar^2$ in formula (III).

An ion represented by $M_3^+$ in formula (V) is preferably a hydrogen ion, a sodium ion, a potassium ion or ammonium ion and a potassium ion or ammonium ion is more preferred.

The number of repetitions represented by n in formula (V) is 1 to 20, and preferably 1 to 10.

Examples of surfactants represented by formula (V) specifically include polyoxyethylene alkyl ether carboxylic acids, polyoxyethylene alkyl ether acetic acids, polyoxyethylene alkyl ether propionic acids and salts thereof. More preferable examples thereof include polyoxyethylene alkyl ether carboxylic acids, polyoxyethylene alkyl ether acetic acids, polyoxyethylene alkyl ether propionic acids and salts thereof, an alkyl group of all of which is a heptyl group, a hexyl group, a pentyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group or an eicocyl group, and still more preferably polyoxyethylene alkyl ether acetic acids, polyoxyethylene alkyl ether propionic acids and salts thereof.

The surfactants represented by formula (V) are commercially available and examples thereof include, for example, EMULSOGEN CLA 050, EMULSOGEN CLA 070, EMULSOGEN CLA 110, EMULSOGEN CNO 080, EMULSOGEN COA 070, EMULSOGEN COL 020, EMULSOGEN COL 080, EMULSOGEN COL 100, SANDOPAN DTC ACID LIQUID, SANDOPAN LS 24 N and SANDOPAN MA-18 (trade name, all manufactured by Clariant); NICCOLAKYPO RLM 45, NICCOLAKYPO RLM 45NV, NICCOLAKYPO RLM 100, NICCOLAKYPO RLM 100NV, NICCOL ECT-3, NICCOL ECT-3NEX, NICCOL ECT-7, NICCOL ECTD-3NEX and NICCOL ECTD-6NEX (trade name, all manufactured by Nikko Chemicals); NEO-HITENOL ECL-30S and NEO-HITENOL ECL-45 (trade name, manufactured by Dai-ichi Kogyo Seiyaku Co., Ltd.); BEAULIGHT LCA-H, BEAULIGHT LCA-30D and BEAULIGHT ECA (trade name, manufactured by Sanyo Chemical Industries, Ltd.); KAO-AKYPO RLM-45, KAO-AKYPO RLM-45NV, KAO-AKYPO RLM-100 and KAO-AKYPO RLM-100NV (trade name, manufactured by Kao Corporation); and ENAGICOL EC-30 (trade name, manufactured by Lion Corporation).

The surfactants represented by formulae (III), (IV) and (V) may be synthesized according to a known method without restricting to a particular one. Furthermore, as the surfactants, commercially available products may be preferably used.

In the case where the polishing composition of the invention contains surfactants represented by formulae (III), (IV) and/or (V), other surfactants and/or hydrophilic polymers may be used together.

Other surfactants and hydrophilic polymers usable together with the surfactants represented by the formulae (III), (IV) and/or (V) that the polishing composition of the invention may contain will be described.

The surfactants represented by formulae (III), (IV) and/or (V) may be used together with various other surfactants and hydrophilic polymers such as shown below. As other anionic surfactants, among the aforementioned anionic surfactants, others than the surfactants represented by formulae (III), (IV) and/or (V) are cited. Examples thereof include carboxylates, sulfonates, ester sulfates and ester phosphates. Examples of the cationic surfactants include, for example, fatty acid amine salts, fatty acid quaternary ammonium salts, benzalconium chloride, benzethonium chloride, pyridinium salts and imidazolium salts. Examples of amphoteric surfactants include carboxyl betaine, aminocarboxylate, imidazolinium betaine, lecithin and alkylamine oxide. Examples of nonionic surfactants include ether type, ether ester type, ester type and nitrogen-containing type. Furthermore, fluorinated surfactants as well may be used.

Examples of the hydrophilic polymers include, for example, polyglycols such as polyethylene glycol, polyvinyl alcohol, polyvinyl pyrrolidone, polysaccharides such as arginic acid, and carboxylic acid-containing polymer such as polymethacrylic acid.

In the case where an object to be polished, to which the polishing composition of the invention is applied, is a silicon substrate for semiconductor integrated circuit, contamination caused by alkali metals, alkaline earth metals and halogenides is not desirable. Accordingly, the hydrophilic polymer is desirably used as acid per se in the case of acid or as ammonium salt. As the hydrophilic polymers, among those mentioned above, ammonium polyacrylate, polyvinyl alcohol, polyvinyl pyrrolidone, polyethylene glycol and polyoxyethylene-polyoxypropylene block polymer are preferably cited.

A weight average molecular weight of the surfactant or hydrophilic polymer that may be added to the polishing composition of the invention is preferably 500 to 100000 and particularly preferably 2000 to 50000.

A total addition amount of the surfactants that are contained in the polishing composition of the invention at the time of use is preferably 0.0001 to 1.0% by mass, more preferably 0.005 to 0.5% by mass and still more preferably 0.01 to 0.2% by mass.

When the surfactants represented by the formulae (III), (IV) and/or (V) are used as the surfactant, addition amounts of the surfactants in the metal polishing composition at the time of use, respectively, are preferably 0.0001 to 0.5% by mass, more preferably 0.005 to 0.2% by mass and still more preferably 0.01 to 0.2% by mass.

When the surfactants represented by the formulae (III), (IV) and/or (V) are used together with other surfactants and/or hydrophilic polymers, addition amounts of the other surfactants and/or hydrophilic polymers in the metal polishing composition at the time of use are preferably 0.0001 to 1.0% by mass, more preferably 0.0005 to 1.0% by mass and still more preferably 0.001 to 1.0% by mass.

1-6. PH of Metal Polishing Composition

In the polishing composition of the invention, the kinds, addition amounts or pHs of the above-mentioned components are preferably set considering the reactivity with and absorptivity to a polishing surface, solubility of polished metals, electrochemical property of a surface to be polished, dissociation states of compound functional groups and stability as a liquid.

The pH in the polishing composition of the invention is preferably 3 to 12 and more preferably 8.0 to 12.0 from the viewpoint of flattening property. The pH is readily controlled by appropriately selecting and adding a buffering agent or an alkali agent.

2. Chemical Mechanical Polishing Method

A chemical mechanical polishing method of the invention (hereinafter, in some cases, referred simply as "polishing method") includes a process of feeding a metal polishing composition of the invention to a polishing pad onto a polishing platen, and a process of rotating the polishing platen and thereby relatively moving the polishing pad with respect to a polishing surface of an object to be polished, while contacting the polishing pad with the polishing surface, in order to polish the polishing surface. In what follows, the chemical mechanical polishing method will be detailed.

(Polishing Unit)

A unit that may perform a polishing method of the invention will be described. As a polishing unit applicable to the invention, a general polishing unit that includes a holder holding an object to be polished (such as semiconductor substrate) having a surface to be polished; and a polishing platen (provided with a motor variable in rotation frequency) to which a polishing pad is bonded may be used. As such a unit, for example, FREX 300 (trade name, manufactured by Ebara Seisakusho) may be used.

(Polishing Pressure)

According to the polishing method, polishing pressure at the polishing, that is, contact pressure between the surface to be polished and the polishing pad is preferably 3000 to 25000 Pa and more preferably 6500 to 14000 Pa.

(Rotation Frequency of Polishing Platen)

According to the polishing method of the invention, the rotation frequency of the polishing platen at the polishing is preferably 50 to 200 rpm and more preferably 60 to 150 rpm.

(Feeding Method of Metal Polishing Composition)

According to a polishing method of the invention, a metal polishing composition is continuously fed onto a polishing pad on a polishing platen with a pump during an object to be polished (target metal) is polished. A feeding amount is not particularly restricted. However, it is preferred that a surface of the polishing pad is always covered with the metal polishing composition.

In the polishing method of the invention, a condensed metal polishing composition may be used by diluting with water or an aqueous solution. As a diluting method, for instance, a method where a piping that feeds a condensed metal polishing composition and a piping that feeds water or an aqueous solution are made to converge midway so as to mix the condensed metal polishing composition and the water or the aqueous solution, and the diluted metal polishing composition is fed onto a polishing pad may be used. In the mixing in this case, a commonly used method such as a method where liquids are forced to go through a narrow path under pressure to collide and mix with each other, a method where a packing material such as glass tubes is filled in a piping to thereby repeatedly divide, separate, and reconverge the flow of liquid, or a method where a blade rotated by motive power is disposed in a piping may be used.

Another dilution method available in the present invention includes the processes of: independently providing a pipeline for feeding the metal polishing composition and a pipeline for feeding water or an aqueous solution; supplying a predetermined amount of liquid from each of the pipelines to the polishing pad; and moving relatively between the polishing pad and the surface to be polished. In a different method available in the present invention, predetermined amounts of condensed metal polishing composition and water or an aqueous solution is filled and mixed in one vessel, and the mixed liquid after diluting so as to be a predetermined concentration is fed onto the polishing pad.

In a further different method available in the present invention, the components to be incorporated in the metal polishing composition is divided into at least two constituent components, and the constituent components are fed onto the polishing pad with dilution by adding water or an aqueous solution. In this case, the components are preferably divided into a constituent component containing the oxidizing agent and a constituent component containing the organic acid, and fed onto the polishing pad.

Specifically, it is preferred to take an oxidizing agent as one constituent component (A) and an organic acid, an additive, a surfactant, a heterocyclic compound (a specific passivation film forming agent, and the like), abrasive grains and water as the other constituent component (B). Then, the constituent component (A) and constituent component (B) are diluted with water or an aqueous solution at the time of use. At this time, three pipings respectively for feeding the constituent component (A), the constituent component (B) and the water or aqueous solution are necessary. The three pipings may be converged to one piping that feeds to the polishing pad to carry out the mixing in the one piping. Alternatively, after two pipings are converged, remaining one piping may be converged therewith to carry out the mixing. For instance, it is possible that one constituent component containing an additive that is difficult to dissolve and the other constituent component are mixed, and after securing time for dissolving by lengthening a mixing path, a piping for water or an aqueous solution is converged therewith to thereby feed the metal polishing composition.

Further, three pipelines are guided to the polishing pad, and the constituent components may be fed onto the polishing surface while the constituent components are mixed by the relative movement between the polishing pad and the surface to be polished. Alternatively, after preparing a mixed liquid by mixing the tree constituent components in one vessel, the mixed liquid may be fed onto the polishing pad. Still further, the metal polishing composition prepared as a condensed liquid, and a diluent water may be independently fed onto the surface to be polished.

(Feed Amount of Metal Polishing Composition)

In the polishing method of the invention, a feed amount on a polishing platen of a metal polishing composition is preferably 50 ml/mil to 500 ml/min and more preferably 100 ml/mil to 300 ml/min.

(Polishing Pad)

A polishing pad capable of using in the polishing method of the invention may be either a non-foamed structure pad or a foamed structure pad without particular restriction. The former uses a hard synthetic resin bulk material like a plastic plate for a pad. The latter is furthermore classified into three categories: a closed cell foam (dry foam material), an open cell foam (wet foam material), and a two-layer composite (laminate material). In particular, the two-layer composite (laminate material) is preferable. Foaming may be either uniform or non-uniform.

The polishing pad usable in the polishing method of the invention may contain abrasive grains for polishing (such as ceria, silica, alumina, resin). There are a soft polishing pad and a hard polishing pad; both are acceptable. In a laminate material, different hardness is preferably used for each layer. The material is preferably unwoven fabric, artificial leather, polyamide, polyurethane, polyester or polycarbonate. In addition, a surface in contact with a surface to be polished may be processed into lattice grooves, holes, concentric grooves or spiral grooves.

Hereinafter, an object to be polished (substrate, wafer), which is subjected to polishing in the polishing method of the invention will be described.

(Metal Wiring Material)

An object to be polished in the invention is preferably a substrate (wafer) having wirings made of copper or a copper alloy. A wiring metal material is suitably a copper alloy containing silver among copper alloys. When a silver content in the copper alloy is 10% by mass or less and further 1% by mass or less, an excellent advantage is exerted, and, in a copper alloy containing silver in the range of 0.00001 to 0.1% by mass, the most excellent advantage is exerted.

(Width of Wiring)

In the present invention, for an object to be polished, for example in DRAM device systems, a half pitch of the wiring is preferably 0.15 μm or less, more preferably 0.10 μm or less, and furthermore preferably 0.08 μm or less. On the other hand, for MPU device systems, a half pitch of the wiring is preferably 0.12 μm or less, more preferably 0.09 μm or less, and furthermore preferably 0.07 μm or less. The metal polishing composition used in the invention exerts a particularly excellent advantage to an object to be polished having such wirings.

(Barrier Metal Material)

In an object to be polished in the present invention, a barrier layer is disposed between a copper wiring and an insulating film (including an interlayer insulating film) to inhibit copper from diffusing. The barrier metal constituting the barrier layer is preferably a metal having low resistance such as TiN, TiW, Ta, TaN, W, or WN, and more preferably Ta or TaN among them.

As mentioned above, according to the invention, a metal polishing composition that is fast in polishing speed, can improve the wiring metal/barrier metal selectivity in polishing, and is capable of inhibiting erosion from occurring in a surface to be polished when it is used in chemical mechanical polishing in production process of a semiconductor device, and a chemical mechanical polishing method that uses the metal polishing composition are provided.

EXAMPLES

Hereinafter, the present invention will be explained with reference to the examples. However, the present invention will not be limited to these examples.

Examples 1 to 21, Comparative Examples 1 to 3

Polishing compositions 101 to 121 and 201 to 203 in Table 1 shown below were prepared, and polishing tests and evaluations were conducted.

(Preparation of Metal Polishing Composition)

In accordance with Table 1, compositions shown below were mixed in pure water and thereby polishing compositions 101 to 121 and 201 to 203 were prepared.

Specific passivation film forming agent or comparison compound: compound shown in Table 1 . . . 7 mmol/L Oxidizing agent: compound shown in Table 1 . . . 1.0% by mass Abrasive grains: abrasive grains shown in Table 1 . . . 0.5% by mass Organic acid: compound shown in Table 1 . . . 0.5% by mass Surfactant: compound shown in Table 1 . . . 0.03% by mass The pH was adjusted to 9.5 with a pH adjusting agent shown in Table 1.

[Evaluation]

With each of the above-obtained polishing compositions 101 to 121 and 201 to 203 (polishing liquids), polishing was conducted according to a polishing method shown below, and the polishing performance (Cu polishing speed, Cu/barrier metal selection ratio) was evaluated. Evaluation results are shown in Table 1.

(Evaluation of Polishing Speed)

A film disposed on a wafer was polished by use of "FREX-300" (trade name, manufactured by Ebara Seisakusho) as a polishing unit under conditions shown below with the slurry feeding, and a polishing speed was calculated.

Substrate: a 12 inch wafer obtained by forming a Ta film or a Ti film (barrier film) having a thickness of 20 nm on a silicon oxide film by sputtering, followed by forming a copper film having a thickness of 50 nm as a wiring by sputtering, further followed by forming a copper film having a total thickness of 1000 nm by plating was used.

Rotation frequency of table: 104 rpm

Rotation frequency of head: 85 rpm (process linear speed=2.0 m/s)

Polishing pressure: 10.5 kPa

Polishing pad: Product No. IC-1400 (manufactured by Rohm and Haas) (XY—K-grv)+(A21)

Slurry feed speed: 300 ml/min

A film thickness of a copper film or barrier film was measured from electric resistances before and after the polishing, and a polishing speed was obtained therefrom. Specifically, a formula shown below was used to calculate.

Polishing speed (nm/min)=(a thickness of a copper film or a barrier film before polishing–a thickness of a copper film or a barrier film after polishing)/polishing time Furthermore, the copper/barrier metal selection ratio was obtained from the polishing speed of the copper film and the polishing speed of the barrier film.

TABLE 1

| Metal polishing composition No. | Specific passivation film forming agent or comparison compound | Oxidizing agent | Abrasive grains Kind | Primary particle diameter (nm) | Organic acid | Surfactant | PH adjusting agent | Kind of Barrier film | Cu polishing speed (nm/min) | Cu/Barrier metal selection ratio |
|---|---|---|---|---|---|---|---|---|---|---|
| Example 1 | 101 | 4 | APS | Colloidal silica A | 35 | — | — | KOH | Ta | 250 | 300 |
| Example 2 | 102 | 2 | KPS | Colloidal silica A | 35 | — | — | KOH | Ta | 230 | 280 |

TABLE 1-continued

| | | | | | | | | | | | |
|---|---|---|---|---|---|---|---|---|---|---|---|
| Example 3 | 103 | 2 | Hydrogen peroxide | Colloidal silica A | 35 | N-methyl glycine | — | Ammonia | Ta | 250 | 650 |
| Example 4 | 104 | 1 | APS | Colloidal silica A | 35 | L-alanine | — | KOH | Ta | 510 | 380 |
| Example 5 | 105 | 1 | APS | Colloidal silica A | 35 | L-alanine | Dodecyl diphenyl ether sulfonic acid | KOH | Ta | 430 | 500 |
| Example 6 | 106 | 1 | APS | Colloidal silica B | 70 | Oxalic acid | Dodecyl diphenyl ether sulfonic acid | KOH | Ta | 470 | 400 |
| Example 7 | 107 | 3 | APS | Colloidal silica A | 35 | Oxalic acid | — | KOH | Ta | 600 | 350 |
| Example 8 | 108 | 3 | APS | Colloidal silica A | 35 | Oxalic acid | Dodecyl benzene sulfonic acid | KOH | Ta | 420 | 600 |
| Example 9 | 109 | 1 | APS | Colloidal silica A | 35 | Oxalic acid | — | KOH | Ta | 800 | 350 |
| Example 10 | 110 | 1 | APS | Colloidal silica A | 35 | Oxalic acid | Dodecyl benzene sulfonic acid | KOH | Ta | 690 | 500 |
| Example 11 | 111 | 4 | APS | Colloidal silica B | 70 | L-alanine | Alkyl diphenyl ether sulfonic acid | KOH | Ta | 500 | 370 |
| Example 12 | 112 | 2 | APS | Colloidal silica A | 35 | Oxalic acid | Alkylbenzene sulfonic acid | KOH | Ta | 450 | 450 |
| Example 13 | 113 | 1 | APS | Colloidal silica A | 35 | L-alanine | Ammonium alkyl benzene sulfonic acid | KOH | Ta | 550 | 420 |
| Example 14 | 114 | 2 | APS | Colloidal silica A | 35 | Oxalic acid | Polyoxyethylene (4) lauryl ether acetic acid | KOH | Ta | 750 | 650 |
| Example 15 | 115 | 1 | KPS | Colloidal silica B | 70 | Oxalic acid | Polyoxyethylene (10) lauryl ether propionic acid | KOH | Ta | 680 | 500 |
| Example 16 | 116 | 3 | APS | Colloidal silica A | 35 | — | Polyoxyethylene (5) dodecyl ether propionic acid | KOH | Ta | 500 | 360 |
| Example 17 | 117 | 4 | Hydrogen peroxide | Colloidal silica A | 35 | Oxalic acid | Polyoxyethylene (8) dodecyl ether propionic acid | KOH | Ta | 350 | 700 |
| Example 18 | 118 | 5 | APS | Colloidal silica A | 35 | Oxalic acid + L-alanine (1:1) | Dodecylbenzene sulfonic acid | KOH | Ta | 600 | 300 |
| Example 19 | 119 | 6 | KPS | Colloidal silica B | 35 | Oxalic acid + L-alanine (1:2) | Alkyl diphenyl ether sulfonic acid | KOH | Ta | 670 | 350 |
| Example 20 | 120 | 7 | APS | Colloidal silica A | 35 | Oxalic acid + L-alanine (1:4) | Alkylbenzene sulfonic acid | KOH | Ta | 550 | 250 |
| Example 21 | 121 | 8 | Hydrogen peroxide | Colloidal silica A | 70 | Oxalic acid + L-alanine (2:1) | Polyoxyethylene (4) lauryl ether acetic acid | KOH | Ta | 550 | 720 |
| Comparative Example 1 | 201 | Benzotriazole | APS | Colloidal silica A | 35 | — | — | KOH | Ta | 80 | 150 |
| Comparative Example 2 | 202 | Indole | APS | Colloidal silica A | 35 | Oxalic acid | — | KOH | Ta | 150 | 180 |
| Comparative Example 3 | 203 | 1-isoquinoline carboxylic acid | APS | Colloidal silica C | 200 | N-methyl glycine | — | KOH | Ta | 350 | 80 |

Among the components described in Table 1, the numeral of a specific passivation film forming agent corresponds to that of a specific example described above. Furthermore, details of APS and KPS used as the oxidizing agent; colloidal silica A to C used as the abrasive grains; and alkyl diphenyl ether sulfonic acid, alkylbenzene sulfonic acid and ammonium alkylbenzene sulfonic acid, which are used as the surfactant are shown below.

APS: Ammonium peroxodisulfate
KPS: Potassium peroxodisulfate
KOH: Potassium hydroxide
Colloidal silica A: "PL-3H" (trade name, manufactured by FUSO CHEMICAL CO., LTD., primary particle diameter: 35 nm)
Colloidal silica B: "PL-7" (trade name, manufactured by FUSO CHEMICAL CO., LTD., primary particle diameter: 70 nm)
Colloidal silica C: "PL-20" (trade name, manufactured by FUSO CHEMICAL CO., LTD., primary particle diameter: 200 nm)
Alkyldiphenyl ether sulfonic acid: PELEX SS-H (trade name, manufactured by Kao Corporation)
Alkylbenzene sulfonic acid: PIONIN A-40-S (trade name, manufactured by TAKEMOTO OIL & FAT CO., LTD.)
Ammonium alkylbenzene sulfonate: prepared by neutralizing PIONIN A-40-S with ammonia water.

From the results shown in Table 1, it is found that the respective metal polishing compositions of the examples improve the Cu/Barrier metal selectivity in the polishing while realizing a faster polishing speed in comparison with the respective metal polishing compositions of the comparative examples. Furthermore, it is found that since the Cu/barrier metal selectivity is improved, erosion is suppressed, and the flatness of a polished surface is improved.

All publications, patent applications, and technical standards mentioned in this specification are herein incorporated by reference to the same extent as if each individual publication, patent application, or technical standard was specifically and individually indicated to be incorporated by reference.

What is claimed is:

1. A metal polishing composition that is used in chemical mechanical polishing in production of a semiconductor device, the metal polishing composition comprising at least the following respective components (1) to (3):
   (1) an oxidizing agent,
   (2) an abrasive grain, and
   (3) at least one compound selected from a compound represented by the following formula (I) and a compound represented by the following formula (II):

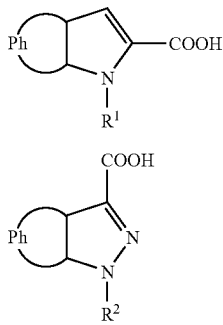

wherein, in formula (I), $R^1$ represents a hydrogen atom or an alkyl group, Ph represents a phenyl ring, and a substituent group, other than $R^1$ and the carboxyl group at 2-position, is optionally bonded to the indole skeleton; and wherein, in formula (II), $R^2$ represents a hydrogen atom or an alkyl group, Ph represents a phenyl ring, and a substituent group, other than $R^2$ and the carboxyl group at 3-position, is optionally bonded to the indazole skeleton.

2. The metal polishing composition according to claim 1, further comprising an organic acid.

3. The metal polishing composition according to claim 1, wherein the oxidizing agent is a peroxodisulfate.

4. The metal polishing composition according to claim 1, further comprising a surfactant.

5. The metal polishing composition according to claim 4, wherein the surfactant is at least one surfactant selected from the group consisting of a surfactant represented by the following formula (III), a surfactant represented by the following formula (IV) and a surfactant represented by the following formula (V):

   Formula (III)

wherein, in formula (III), $R^3$ represents a straight or branched alkyl group having 8 to 20 carbon atoms, $Ar^1$ and $Ar^2$ each independently represent an arylene group, and $M_1^+$ represents a hydrogen ion, an alkali metal ion or ammonium;

   Formula (IV)

wherein, in formula (IV), $R^4$ represents a straight or branched alkyl group having 8 to 20 carbon atoms, $Ar^3$ represents an arylene group, and $M_2^+$ represents a hydrogen ion, an alkali metal ion or ammonium; and

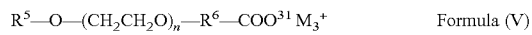   Formula (V)

wherein, in formula (V), $R^5$ represents a straight or branched alkyl group having 8 to 20 carbon atoms, n represents an integer from 1 to 20, $R^6$ represents a straight or branched alkylene group having 1 to 5 carbon atoms, and $M_3^+$ represents a hydrogen ion, an alkali metal ion or ammonium.

6. The metal polishing composition according to claim 1, wherein the abrasive grain is a colloidal silica having a primary particle diameter of from 20 nm to 150 nm.

7. A chemical mechanical polishing method comprising:
   feeding the metal polishing composition according to claim 1 onto a polishing pad on a polishing platen; and
   rotating the polishing platen and thereby relatively moving the polishing pad with respect to a polishing surface of an object to be polished, while contacting the polishing pad with the polishing surface, in order to polish the polishing surface.

* * * * *